US010239405B2

(12) United States Patent
Suzuki et al.

(10) Patent No.: US 10,239,405 B2
(45) Date of Patent: Mar. 26, 2019

(54) FUEL CELL EQUIPPED VEHICLE SYSTEM AND CONTROL METHOD FOR FUEL CELL EQUIPPED VEHICLE SYSTEM

(71) Applicant: NISSAN MOTOR CO., LTD., Yokohama-shi, Kanagawa (JP)

(72) Inventors: Kenta Suzuki, Kanagawa (JP); Mitsunori Kumada, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 16/062,439

(22) PCT Filed: Nov. 10, 2016

(86) PCT No.: PCT/JP2016/083430
§ 371 (c)(1),
(2) Date: Jun. 14, 2018

(87) PCT Pub. No.: WO2017/104319
PCT Pub. Date: Jun. 22, 2017

(65) Prior Publication Data
US 2018/0370366 A1    Dec. 27, 2018

(30) Foreign Application Priority Data

Dec. 15, 2015    (JP) ................. 2015-243954

(51) Int. Cl.
*B60L 3/00* (2006.01)
*B60L 11/18* (2006.01)
(Continued)

(52) U.S. Cl.
CPC .......... *B60L 3/0053* (2013.01); *B60L 3/0046* (2013.01); *B60L 11/1887* (2013.01);
(Continued)

(58) Field of Classification Search
None
See application file for complete search history.

(56) References Cited

U.S. PATENT DOCUMENTS 8,273,490 B2    9/2012   Umayahara et al.
2010/0209792 A1  8/2010   Umayahara et al.

FOREIGN PATENT DOCUMENTS

EP    3 020 594 A1    5/2016
JP    2007-147364 A   6/2007
(Continued)

*Primary Examiner* — Sarah A. Slifka
(74) *Attorney, Agent, or Firm* — Foley & Lardner LLP

(57) ABSTRACT

A fuel cell equipped vehicle system in which an external power supply is coupled to an electric power supply line, the electric power supply line being coupled to a fuel cell, an electric power being input/output to/from a vehicular battery through the electric power supply line, the fuel cell equipped vehicle system performing an insulation test of the electric power supply line before charging the vehicular battery, the fuel cell equipped vehicle system including an insulation test unit configured to perform the insulation test of the electric power supply line; a switch that couples and cuts off between the fuel cell and the electric power supply line; and a control unit configured to control a coupling and a cutoff to/from the electric power supply line of the vehicular battery and control the switch, wherein the control unit is configured to cut off the vehicular battery from the electric power supply line and control the switch to cut off the fuel cell from the electric power supply line, and then drive the insulation test unit.

18 Claims, 7 Drawing Sheets

(51) Int. Cl.
*H01M 8/12* (2016.01)
*H01M 8/04828* (2016.01)
*H01M 8/04858* (2016.01)

(52) U.S. Cl.
CPC ....... *B60L 11/1892* (2013.01); *H01M 8/0488* (2013.01); *H01M 8/0494* (2013.01); *H01M 8/12* (2013.01)

(56) References Cited

FOREIGN PATENT DOCUMENTS

| | | |
|---|---|---|
| JP | 2007-329045 A | 12/2007 |
| JP | 2009-158162 A | 7/2009 |
| JP | 2012-105540 A | 5/2012 |
| JP | 2014-68490 A | 4/2014 |
| JP | 2014-195372 A | 10/2014 |

FUEL CELL EQUIPPED VEHICLE SYSTEM AND CONTROL METHOD FOR FUEL CELL EQUIPPED VEHICLE SYSTEM

TECHNICAL FIELD

The present invention relates to a fuel cell equipped vehicle system and a control method for the fuel cell equipped vehicle system.

BACKGROUND ART

JP2014-68490A discloses a vehicle system in which a fuel cell is coupled to an electric power supply line that couples a vehicular battery to a motor. In light of increasing options for electric power supply, a possible configuration is to couple an external power supply in the above-described vehicle system to charge the vehicular battery. In this case, the external power supply is coupled to the aforementioned electric power supply line. For an on-vehicle fuel cell, it is proposed to use a solid oxide fuel cell, which has conversion efficiency higher than that of a conventional solid polymer fuel cell.

SUMMARY OF INVENTION

Here, in a case where a vehicular battery is charged with an external power supply, it is necessary to preliminarily perform an insulation test to an electric power supply line. However, it is difficult to perform the insulation test of the electric power supply line with certainty in a state where the fuel cell is coupled to the electric power supply line. The aforementioned solid oxide fuel cell requires electric power for an auxiliary machine that drives the fuel cell even during a stop control; therefore there is a case where the electric power is supplied from the vehicular battery. In this case, however, the insulation test cannot be performed until the stop control is terminated and cutting off the vehicular battery during the stop control possibly causes an unstable stop control.

It is an object of the present invention to provide a fuel cell equipped vehicle system configured to perform an insulation test of an electric power supply line performed before an external power supply charges a vehicular battery and a control method for the fuel cell equipped vehicle system.

A fuel cell equipped vehicle system according to one embodiment of the present invention is a fuel cell equipped vehicle system in which an external power supply is coupled to an electric power supply line, the electric power supply line being coupled to a fuel cell, an electric power being input/output to/from a vehicular battery through the electric power supply line, the fuel cell equipped vehicle system performing an insulation test of the electric power supply line before charging the vehicular battery, the fuel cell equipped vehicle system including an insulation test unit configured to perform the insulation test of the electric power supply line; a switch that couples and cuts off between the fuel cell and the electric power supply line; and a control unit configured to control a coupling and a cutoff to/from the electric power supply line of the vehicular battery and control the switch, wherein the control unit is configured to cut off the vehicular battery from the electric power supply line and control the switch to cut off the fuel cell from the electric power supply line, and then drive the insulation test unit.

DESCRIPTION OF EMBODIMENTS

The following describes embodiments of the present invention with reference to drawings.

Figure 1:
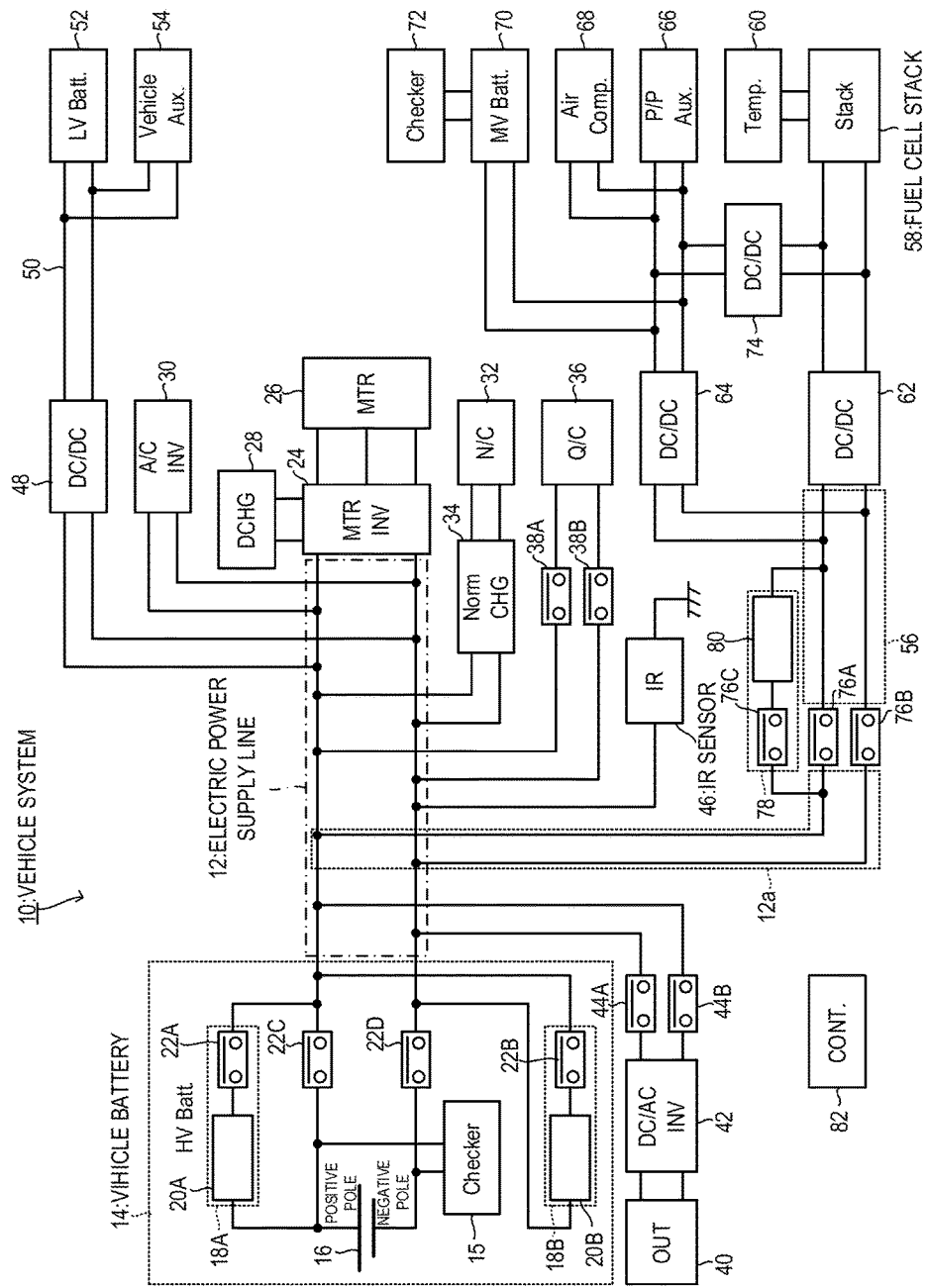
FIG. 1 is a block diagram illustrating a main configuration of a fuel cell equipped vehicle system according to an embodiment.

Configuration of Fuel Cell Equipped Vehicle System According to First Embodiment FIG. 1 is a block diagram illustrating a main configuration of a fuel cell equipped vehicle system according to an embodiment. The fuel cell equipped vehicle system (hereinafter referred to as a vehicle system 10) according to the embodiment is entirely controlled by a control unit 82. The vehicle system 10 is configured such that, for example, a fuel cell stack 58 (a fuel cell) is coupled to an electric power supply line 12 (for example, 360V), which couples a vehicular battery 14 to a drive motor 26 (a motor driving inverter 24), via, for example, a coupling line 56. A low-voltage line 50 is coupled to the electric power supply line 12 via a DC-DC converter 48.

The electric power supply line 12 inputs/outputs electric power to/from the vehicular battery 14 and the motor driving inverter 24. The vehicular battery 14, the motor driving inverter 24 (the drive motor 26), the DC-DC converter 48, a low speed charging terminal 32, a rapid charging terminal 36 (a charging terminal), an external coupling terminal 40, an IR sensor 46 (an insulation test unit), and an air conditioner inverter 30 are coupled to the electric power supply line 12. A branch line 12a, which is for coupling to the coupling line 56, branches from the electric power supply line 12.

The DC-DC converter 48, a vehicular auxiliary machine battery 52, and a vehicular auxiliary machine 54 are coupled to the low-voltage line 50.

The coupling line 56 is coupled to the branch line 12a via switches 76A and 76B. A DC-DC converter 62 (the fuel cell stack 58) and a DC-DC converter 64 are coupled to the coupling line 56. A charging circuit 78 constituted of a series circuit of a resistive element 80 and a switch 76C is coupled in parallel to the switch 76A.

The vehicular battery 14 includes a main power supply 16 (for example, 360V) coupled to the electric power supply line 12, a switch 22C coupled to a side of the positive pole of the main power supply 16, a switch 22D coupled to a side of the negative pole of the main power supply 16. The switch 22C has one end coupled to the positive pole side of the main power supply 16 and the other end coupled to a side of the positive pole of the electric power supply line 12. The switch 22D has one end coupled to the negative pole side of the main power supply 16 and the other end coupled to a side of the negative pole of the electric power supply line 12. In the positive pole side of the main power supply 16, a charging circuit 18A as a series circuit of a resistive element 20A and a switch 22A is coupled in parallel to the switch 22C. Furthermore, a charging circuit 18B as a series circuit of a resistive element 20B and a switch 22B is coupled to a side of the electric power supply line 12 of the switch 22C and the electric power supply line 12 side of the switch 22D. It should be noted that while the switches 22A to 22D are ON/OFF controlled by the control unit 82, the switches 22A to 22D may be configured to be ON/OFF controlled by a dedicated control unit other than the control unit 82.

The charging circuits 18A and 18B are temporarily used when the vehicular battery 14 is coupled to the electric power supply line 12 to charge an electric charge to, for example, a capacitor inside the motor driving inverter 24 and avoids a damage to, for example, the vehicular battery 14 and the motor driving inverter 24 by avoiding an inrush current at coupling. The vehicular battery 14 (the main power supply 16) includes a charge checker 15 that measures its amount of charge. When the amount of charge decreases to lower than a certain value, the charge checker 15 outputs a charge request signal to the control unit 82 and when the amount of charge reaches the certain value or more, the charge checker 15 stops the output of the charge request signal.

The motor driving inverter 24 is coupled to the electric power supply line 12 (the positive pole side and the negative pole side), converts electric power (a DC voltage) supplied from the vehicular battery 14 or the fuel cell stack 58 into three-phase AC power, and supplies this to the drive motor 26 to rotate the drive motor 26. The motor driving inverter 24 converts regenerative electric power generated by the drive motor 26 at braking of a vehicle into electric power of DC voltage to supply the electric power of DC voltage to the vehicular battery 14.

When the vehicle system 10 is stopped, the vehicular battery 14 is cut off from the electric power supply line 12. At this time, the capacitor included in the motor driving inverter 24 remains storing the electric charge; therefore, the electric power supply line 12 maintains a high voltage even after the cutoff. However, it is necessary to decrease the voltage of the electric power supply line 12 to equal to or less than a predetermined voltage (for example, 60V) in order to prevent an electric leakage. Therefore, the motor driving inverter 24 includes a discharge circuit 28 to discharge the electric charge stored in the capacitor in order to step down the voltage of the electric power supply line 12.

The low speed charging terminal 32 is coupled to an external AC power supply (not illustrated) of an AC voltage, such as a household power source, to charge the vehicular battery 14. The low speed charging terminal 32 is coupled to the electric power supply line 12 via a charger 34, which converts the AC voltage into a DC voltage applied to the electric power supply line 12. The low speed charging terminal 32 includes a limit switch (not illustrated) to output a detection signal to the control unit 82 as soon as the low speed charging terminal 32 is coupled to the external AC power supply.

The rapid charging terminal 36 (a charging terminal) is coupled to an external DC power supply (an external power supply, not illustrated) in, for example, a service station built similarly to a gas station to supply a DC voltage to output this DC voltage to the electric power supply line 12 to rapidly charge the vehicular battery 14. The rapid charging terminal 36 is coupled to the electric power supply line 12 via switches 38A and 38B. The rapid charging terminal 36 also includes a limit switch (not illustrated) to output a detection signal to the control unit 82 as soon as the rapid charging terminal 36 is coupled to the external DC power supply. In the embodiment, the rapid charging has a case of being performed after the stop control of the fuel cell stack 58 is completed and a case of being performed still in the stop control as described below.

The external coupling terminal 40 is coupled to an external device (not illustrated), such as household equipment, and drives the external device with the electric power from the vehicular battery 14 or the fuel cell stack 58. The external coupling terminal 40 is coupled to the electric power supply line 12 via an external coupling inverter 42 and switches 44A and 44B. It should be noted that the external coupling terminal 40 also includes a limit switch (not illustrated) such that the limit switch outputs a detection signal to the control unit 82 as soon as the external coupling terminal 40 is coupled to the external device.

The IR sensor 46 (an insulation test unit) is coupled to the negative pole side of the electric power supply line 12 and a vehicular body (not illustrated), applies a constant voltage (for example, 600V) between both the sides, and measures a stray capacitance between both the sides. An insulation resistance of the electric power supply line 12 to the body is calculated from this stray capacitance, and it can be determined whether an electric leakage of the electric power supply line 12 is present or absent from the magnitude of the insulation resistance.

Additionally, for example, the air conditioner inverter 30 for an air conditioner in the vehicle is coupled to the electric power supply line 12.

The DC-DC converter 48 is coupled to the electric power supply line 12 and steps down the DC voltage of the electric power supply line 12 to supply the electric power of the low DC voltage (for example, 12V) to the low-voltage line 50.

The vehicular auxiliary machine battery 52 is charged by the electric power supply from the DC-DC converter 48 and supplies the electric power to the vehicular auxiliary machine 54. The vehicular auxiliary machine 54 is, for example, a vehicular illumination and a car navigation system and is equipment operated with electric power with a lower voltage range and a lower-current (low electric power) than that of the drive motor 26.

The fuel cell stack 58 is a solid oxide fuel cell (SOFC). The fuel cell stack 58 is provided by stacking cells obtained by an electrolyte layer made of a solid oxide, such as ceramic, being sandwiched between an anode (a fuel pole) to which an anode gas (a fuel gas) reformed by a reformer is supplied and a cathode (an air pole) to which an air containing oxygen as a cathode gas (an oxidizing gas) is supplied. The fuel cell stack 58 is coupled to the coupling line 56 via the DC-DC converter 62. It should be noted that the fuel cell stack 58 includes a temperature sensor 60 that measures a temperature inside the fuel cell stack 58.

The DC-DC converter 62 has an input side coupled to the fuel cell stack 58 and an output side (a step up side) coupled to the coupling line 56. The DC-DC converter 62 steps up the output voltage (for example, 60V or a voltage equal to or less than it) of the fuel cell stack 58 to a voltage of the electric power supply line 12 and supplies the voltage to the coupling line 56. This supplies the electric power from the fuel cell stack 58 to the vehicular battery 14 or the drive motor 26 (the motor driving inverter 24) via the coupling line 56 and the electric power supply line 12.

The DC-DC converter 64 has an input side coupled to the coupling line 56 and an output side (a step down side, for example, 42V) coupled in parallel to a fuel cell auxiliary machine 66 (a first auxiliary machine), a compressor 68 (a second auxiliary machine), a fuel cell battery 70, and a DC-DC converter 74 (a third auxiliary machine).

It should be noted that the DC-DC converter 62 and the DC-DC converter 64 include discharge circuits (not illustrated) similarly to the motor driving inverter 24. The discharge circuits can be driven on condition that the coupling line 56 is cut off from the electric power supply line 12 by the control described below and the stop control of the fuel cell stack 58 is terminated. The discharge circuits can step down the voltages of sides of the coupling line 56 (a step up side) of the DC-DC converter 62 and the DC-DC converter 64 to equal to or less than a predetermined voltage (for example, 60V).

The fuel cell auxiliary machine 66 is a pump that supplies a fuel to the fuel cell stack 58. The compressor 68 supplies, for example, the cathode gas (an air) to the fuel cell stack 58.

Additionally, auxiliary machines driving the fuel cell stack 58 include, for example, a valve (not illustrated) that opens and closes a passage through which the anode gas and the cathode gas are distributed and a diffusion combustor (not illustrated) that generates a combustion gas for heating supplied to the fuel cell stack 58 during the activation control. Any of the above-described auxiliary machines operate with the low electric power as is the case with the above description.

The fuel cell battery 70 is charged by the electric power supply from the DC-DC converter 64 and can supply the electric power to the fuel cell auxiliary machine 66, the compressor 68, and the DC-DC converter 74. It should be noted that the fuel cell battery 70 includes a charge checker 72 that measures its amount of charge. When the amount of charge decreases to lower than a certain value, the charge checker 72 outputs a charge request signal to the control unit 82 and when the amount of charge reaches the certain value or more, the charge checker 72 stops the output of the charge request signal.

As described below, the DC-DC converter 74 is a circuit that applies an electromotive force (an anode protection voltage) that opposes that of the fuel cell stack 58 to the fuel cell stack 58 from an outside during a stop control of the fuel cell stack 58. The DC-DC converter 74 steps up (or steps down) the output voltage of the DC-DC converter 64 and applies the anode protection voltage to the fuel cell stack 58.

In the activation control of the fuel cell stack 58, a combustion gas, which is made by mixing and combusting a fuel for activation and an air, is generated using the diffusion combustor, the fuel cell auxiliary machine 66 (the first auxiliary machine), and the compressor 68 (the second auxiliary machine). This is supplied to the cathode of the fuel cell stack 58 instead of the cathode gas and the fuel cell stack 58 is heated up to a temperature required for an electric generation. Although the details will be described below, the stop control of the fuel cell stack 58 is a control to decrease the temperature of the fuel cell stack 58 down to an upper limit temperature at which the oxidation of the anode is avoidable, and the fuel cell auxiliary machine 66, the compressor 68, and the DC-DC converter 74 (the third auxiliary machine) are used then.

The switch 76A (a switch) is disposed in a side of the positive pole of the coupling line 56. The switch 76A has one end coupled to a side of the positive pole of the branch line 12a and the other end coupled to, for example, the DC-DC converter 62. Similarly, the switch 76B (a switch) is disposed in a side of the negative pole of the coupling line 56. The switch 76B has one end coupled to a side of the negative pole of the branch line 12a and the other end coupled to, for example, the DC-DC converter 62. The switch 76A and the switch 76B cut off (OFF) and couple (ON) between the coupling line 56 and the branch line 12a. The charging circuit 78 as a series circuit of the resistive element 80 and the switch 76C is coupled in parallel to the switch 76A. The charging circuit 78 has one end coupled to the positive pole side of the branch line 12a and the other end coupled to the positive pole side of the coupling line 56. The charging circuit 78 is temporarily used when the vehicular battery 14 is coupled to, for example, the DC-DC converter 62 to charge an electric charge to the capacitor that belongs to, for example, the DC-DC converter 62 and avoids a damage to, for example, the vehicular battery 14 and the DC-DC converter 62 by avoiding an inrush current at coupling.

The control unit 82 is constituted of general-purpose electronic circuits and peripheral devices including a microcomputer, a microprocessor, and a CPU and executes specific programs to execute processes in order to control the vehicle system 10. At that time, the control unit 82 can perform drive/stop controls (ON/OFF controls) of the above-described respective components.

[Activation Control Procedure of Vehicle System]

Figure 2:
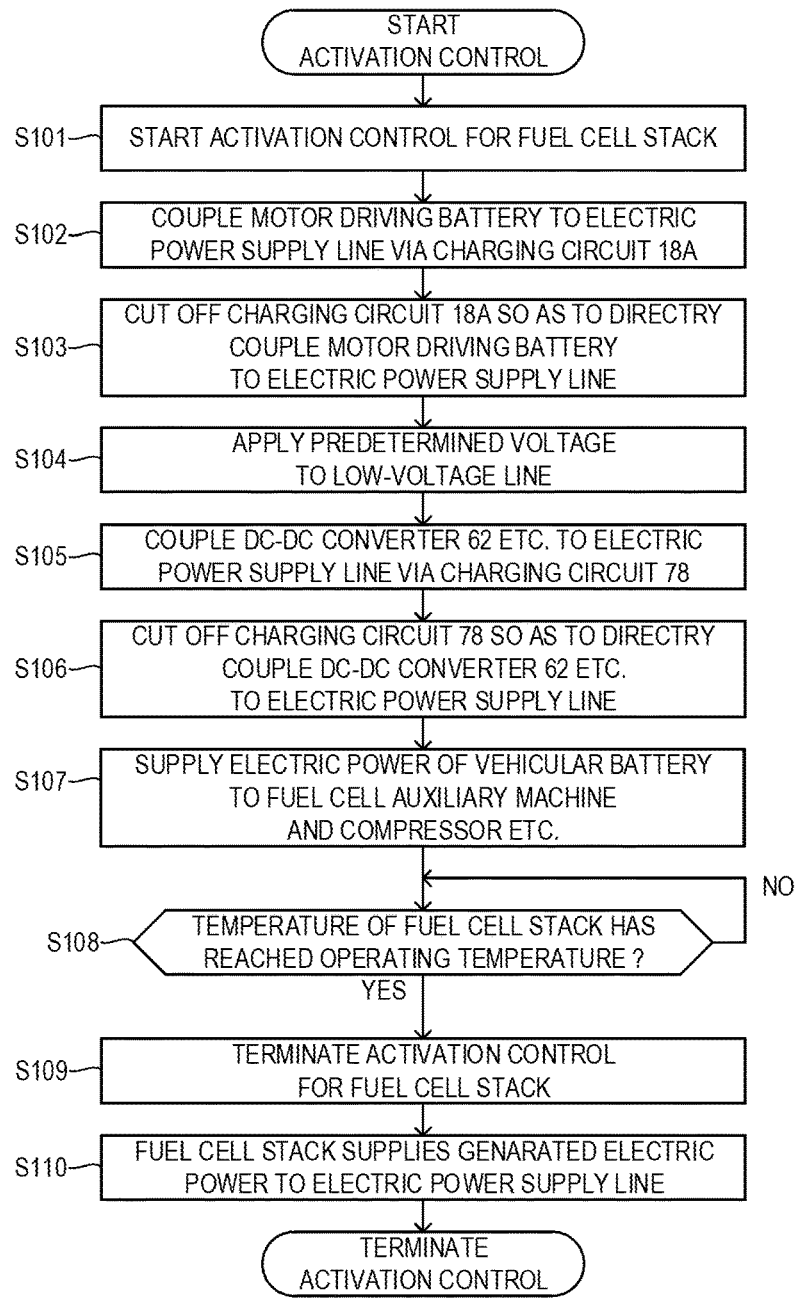
FIG. 2 is a flowchart illustrating a procedure of an activation control of the fuel cell equipped vehicle system according to the embodiment.

An activation control procedure of the vehicle system 10 according to the embodiment will be described in accordance with a flowchart in FIG. 2. In an initial state, all the switches 22A to 22D, 38A, 38B, 44A, 44B, and 76A to 76C are OFF, and the electric power supply line 12 and the coupling line 56 are stepped down to equal to or less than a predetermined voltage (for example, 60V). It is also assumed that the vehicular battery 14 and the fuel cell battery 70 have reached respective predetermined amounts of charge.

As soon as the system starts the activation control, the control unit 82 turns the diffusion combustor, the fuel cell auxiliary machine 66, and the compressor 68 ON to start the activation control for the fuel cell stack 58 at Step S101. At that time, the fuel cell auxiliary machine 66 and the compressor 68 are driven by the electric power from the fuel cell battery 70. This causes the activation control of the fuel cell stack 58 to be performed for the fuel cell stack 58 until reaching a temperature required for an electric generation. On the other hand, the vehicular auxiliary machine 54 can be driven by the vehicular auxiliary machine battery 52.

At Step S102, the control unit 82 (or a control unit dedicated to the vehicular battery 14) turns the switch 22A and the switch 22D ON to couple the vehicular battery 14 to the electric power supply line 12 via the charging circuits 18A and 18B, and applies a predetermined voltage (for example, 360V) to the electric power supply line 12, the motor driving inverter 24, the DC-DC converter 48, and the air conditioner inverter 30. At this time, the control unit 82 (or the control unit dedicated to the vehicular battery 14) also turns the switch 22B ON to apply the voltage to the charging circuit 18B coupled in parallel to the electric power supply line 12. After a predetermined time at Step S102, the control unit 82 (or the control unit dedicated to the vehicular battery 14) turns the switch 22C ON and then turns the switch 22A OFF to cut off the charging circuit 18A so as to directly couple the vehicular battery 14 to the electric power supply line 12 at Step S103. At this time, the control unit 82 (or the control unit dedicated to the vehicular battery 14) also turns the switch 22B OFF to cut off the charging circuit 18B. This ensures a rotation of the drive motor 26 at any rotation speed on the basis of an accelerator operation of a driver.

At Step S104, the control unit 82 turns the DC-DC converter 48 ON to apply a predetermined voltage (for example, 12V) to the low-voltage line 50. This ensures the vehicular auxiliary machine 54 receiving the electric power supply from the vehicular auxiliary machine battery 52 and the DC-DC converter 48 to be driven. At this time, the vehicular auxiliary machine battery 52 is charged with the DC-DC converter 48. At this time, the control unit 82 turns the air conditioner inverter 30 ON to cause the air conditioner for a vehicle interior to be in a usable state.

At Step S105, the control unit 82 turns the switch 76B and the switch 76C ON to apply a predetermined voltage to the coupling line 56 (for example, the DC-DC converter 62) via the charging circuit 78. Then, after a predetermined time at Step S105, the control unit 82 turns the switch 76A ON and then turns the switch 76C OFF to cut off the charging circuit 78 so as to directly couple the electric power supply line 12 to the coupling line 56 (for example, the DC-DC converter 62) at Step S106. The control unit 82 turns the DC-DC converter 64 ON at Step S107 so as to ensure supplying the electric power of the vehicular battery 14 to the fuel cell auxiliary machine 66, the compressor 68 and the fuel cell battery 70 (and the DC-DC converter 74).

At Step S108, the control unit 82 determines whether the fuel cell stack 58 has reached an operating temperature required for the electric generation or not from a temperature measured by the temperature sensor 60. After the fuel cell stack 58 reaches the operating temperature, the control unit 82 turns the diffusion combustor OFF and terminates the activation control for the fuel cell stack 58, and supplies the anode gas (the reformed gas) to the anode of the fuel cell stack 58 with the fuel cell auxiliary machine 66 and supplies the cathode gas to the cathode of the fuel cell stack 58 with the compressor 68 to cause the fuel cell stack 58 to generate the electric power by electrochemical reaction at Step S109.

At Step S110, the control unit 82 turns the DC-DC converter 62 ON. This causes the fuel cell stack 58 to supply the generated electric power to the electric power supply line 12 via the DC-DC converter 62. The fuel cell stack 58 supplies the generated electric power to the fuel cell auxiliary machine 66, the compressor 68 and the fuel cell battery 70 (and the DC-DC converter 74) via the DC-DC converter 62 and the DC-DC converter 64. The activation control of the vehicle system 10 is thus terminated.

[Operation of Vehicle System in Usual Electric Generation]

The drive motor 26 receives the electric power supply from the vehicular battery 14 and the fuel cell stack 58 and rotates at any rotation speed by the accelerator operation of the driver. The drive motor 26 generates the regenerative electric power at braking, and this is charged to the vehicular battery 14 via the motor driving inverter 24.

The control unit 82 causes the electric generation with a predetermined electric power in the fuel cell stack 58 while receiving the charge request signal from the charge checker 15 and supplies the electric power to the vehicular battery 14 (and the motor driving inverter 24) to charge the vehicular battery 14. When the charge request signal from the charge checker 15 stops, a control, such as decreasing the amount of power generation of the fuel cell stack 58 and supplying the electric power to the motor driving inverter 24, is performed.

The fuel cell battery 70 is charged by the electric power supply from the DC-DC converter 64 and supplies the electric power to the fuel cell auxiliary machine 66 and the compressor 68. The fuel cell auxiliary machine 66 and the compressor 68 can receive the supply of the electric power from the DC-DC converter 64 and the fuel cell battery 70 to be driven.

[Stop Control of Fuel Cell Stack]

The stop controls of the fuel cell stack 58 include the following methods of Control A to Control D.

Control A: Forcible Cooling

A pump (the fuel cell auxiliary machine 66) that supplies a fuel is stopped to stop supplying the fuel while the compressor 68 is continuously operated to continuously supply the cathode gas as a cooling gas to the fuel cell stack 58. This cooling gas causes an air-cooling of the fuel cell stack 58. At this time, in order to prevent the oxidation of the anode, a control to close a valve (the fuel cell auxiliary machine 66) in a discharge passage of the anode off-gas after use to prevent the oxygen from flowing backward is performed.

Control B: Anode Protection Voltage Application

For a control to electrically prevent the oxidation of the anode, the electromotive force (the anode protection voltage) that opposes that of the fuel cell stack 58 is applied to the fuel cell stack 58 from the outside using the DC-DC converter 74.

When the fuel cell stack 58 is caused to stop while remaining in a high temperature, the oxygen invades into the anode when the supply of the anode gas is stopped. This oxygen reacts with nickel of the anode pole to cause nickel oxide, thus possibly causing, for example, a crack in the anode pole. Therefore, in this embodiment, the electromotive force that opposes that of the fuel cell stack 58 is applied from the outside of the fuel cell stack 58 in order to prevent this. This can cause a flow of the current (the electric charge) to oppose the usual flow; therefore, the oxygen flown into the anode can be transmitted to the cathode side through an electrolyte membrane in association with the move of the electric charge is changed from toward the anode to toward the cathode. This reduces the reaction with the nickel of the anode pole. It should be noted that while the fuel cell stack 58 generates an electric potential with the presence of the oxygen in the cathode and the fuel gas on the anode, it is needless to say that the counter-electromotive force applied from the outside needs to be higher than an open end voltage of the fuel cell stack 58.

In this case, the fuel cell stack 58 naturally decreases its temperature by emitting the heat in the atmosphere. It should be noted that, also in this case, it is preferable to perform the control that closes the valve (the fuel cell auxiliary machine 66) in the discharge passage of the anode off-gas after use to prevent the oxygen from flowing backward.

Control C: Forcible Cooling+Anode Protection Voltage Application

The Control C is a control that combines the Control A and the Control B and ensures performing the stop control in a short time with certainty by the short period cooling by the forcible cooling and the electrical oxidation prevention control of the anode by the anode protection voltage.

Control D: Self-Sustained Operation Cooling

An output of the pump (the fuel cell auxiliary machine 66) that supplies the fuel is decreased and the temperature of the fuel cell stack 58 is decreased while maintaining the generated power with which the fuel cell stack 58 can barely cover the power consumption of the fuel cell auxiliary machine 66 and the compressor 68 (and barely charge the fuel cell battery 70). At this time, the cathode gas serves not only as the cathode gas but also as the cooling gas.

Among the above-described methods, the Control A to the Control C require the electric power of the vehicular battery 14 or the fuel cell battery 70. On the other hand, the Control D can perform the self-sustainable stop control without using the electric power of the vehicular battery 14 or the fuel cell battery 70.

[Relation Between Rapid Charge Control and Stop Control of Fuel Cell Stack in Vehicle System]

When the vehicular battery 14 of the vehicle system 10 is rapidly charged by an operation of a driver, it is assumed that the charge is performed immediately after the vehicle stop. At this time, the fuel cell stack 58 has already started the stop control but there may be a case where it is not yet terminated, that is, a case where the rapid charging and the stop control are simultaneously performed. However, before performing the rapid charging, the insulation test of the electric power supply line 12 is required in order to prevent the electric leakage. Here, when the insulation test is performed, it is required to cut off the vehicular battery 14 and the coupling line 56 from the electric power supply line 12 in order to accurately measure the insulation resistance of the electric power supply line 12.

When the above-described Control D is performed as the stop control of the fuel cell stack 58, since the electric power from the fuel cell stack 58 is supplied to the fuel cell auxiliary machine 66 and the compressor 68, the stop control can be performed continuously in a similar state even though the coupling line 56 is cut off from the electric power supply line 12.

On the other hand, when any one of the above-described Control A, Control B, or Control C is performed as the stop control of the fuel cell stack 58, a constant electric power is required as described above. That electric power is supplied from the fuel cell battery 70 and the vehicular battery 14. Accordingly, the electric power is covered only by the fuel cell battery 70 when the coupling line 56 is cut off from the electric power supply line 12, and in the case where the amount of charge becomes lower than a predetermined amount, the stop control cannot be performed continuously in a similar state, and the stop control becomes unstable. Therefore, this embodiment considers the above so as to ensure concurrently performing the rapid charging of the vehicular battery 14 and the stop control of the fuel cell stack 58 with more certainty.

[Rapid Charge Control Procedure in Accordance with Stop Control of Vehicle System]

Figure 3:
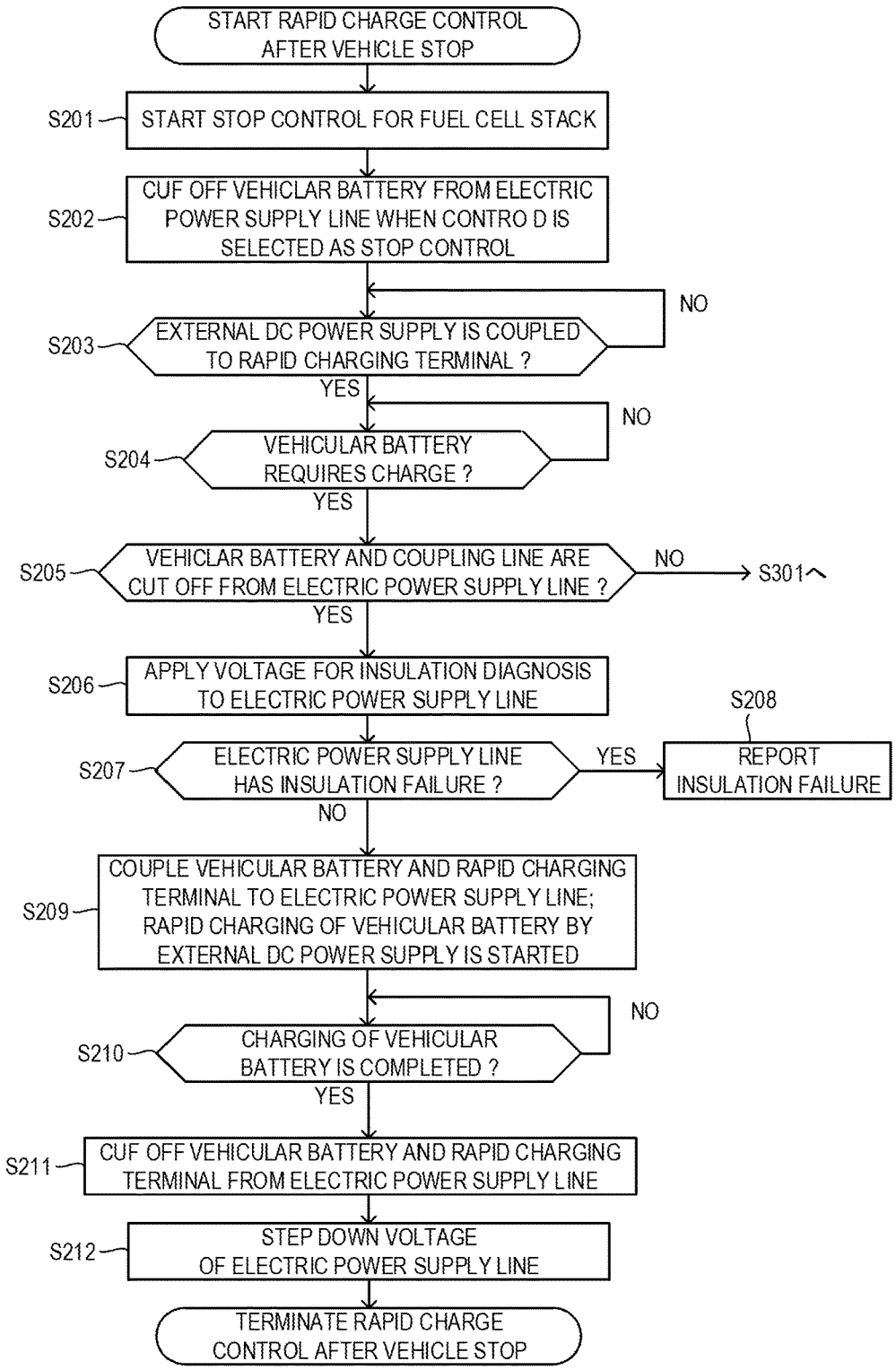
FIG. 3 is a flowchart illustrating a procedure of a rapid charge control after a vehicle stop of the fuel cell equipped vehicle system according to the embodiment.

A rapid charge control procedure after the vehicle stop of the vehicle system 10 according to the embodiment will be described in accordance with FIG. 3. At Step S201, the control unit 82 (the stop control unit) starts the stop control for the fuel cell stack 58 after the vehicle stop. At this time, any one of the above-described Control A, Control B, Control C and Control D is performed for the stop control. At Step S201, when the Control D is selected as the stop control, the control unit 82 (the stop control unit) turns the switches 76A and 76B OFF to cut off the coupling line 56 (the fuel cell stack 58) from the electric power supply line 12. Then, at Step S202, the switches 22C and 22D are turned OFF to cut off the vehicular battery 14 from the electric power supply line 12.

At Step S203, the control unit 82 determines whether the detection signal is input from the limit switch of the rapid charging terminal 36 or not, that is, whether the external DC power supply is coupled to the rapid charging terminal 36 or not. After the external DC power supply is coupled to the rapid charging terminal 36, the control unit 82 determines whether the charge request signal is input from the charge checker 15 or not, that is, whether the vehicular battery 14 requires a charge or not at Step S204.

After determining that the vehicular battery 14 requires the charge, the control unit 82 determines whether the vehicular battery 14 and the coupling line 56 are cut off from the electric power supply line 12 or not from ON/OFF states of the switches 22C and 22D and the switches 76A and 76B at Step S205.

When it is determined that all the above-described switches are OFF at Step S205, the control unit 82 turns the IR sensor 46 ON and applies the voltage for an insulation diagnosis to the electric power supply line 12 at Step S206. Here, when all the above-described switches are OFF is when the stop control is terminated or the stop control is continued by the Control D.

On the other hand, when it is determined that all the above-described switches are ON at Step S205, that is, when any one of the Control A, the Control B, or the Control C is currently continued by the control of the control unit 82 (the stop control unit) and the vehicular battery 14 still supplies the electric power for the stop control to the coupling line 56, the procedure transitions to Step S301 described below.

After Step S206, the control unit 82 determines whether the electric power supply line 12 has an insulation failure or not, that is, whether the electric power supply line 12 has a predetermined insulation resistance or not at Step S207. When it is determined that there is the insulation failure at Step S207, the IR sensor 46 is stopped and the insulation failure is reported to abort the process afterward at Step S208.

When it is determined that there is no insulation failure at Step S207, the IR sensor 46 is turned OFF and the switches 22C and 22D and the switches 38A and 38B are turned ON to couple the vehicular battery 14 and the rapid charging terminal 36 to the electric power supply line 12, and the rapid charging of the vehicular battery 14 by the external DC power supply coupled to the rapid charging terminal 36 is started at Step S209. It should be noted that when the vehicular battery 14 is coupled to the electric power supply line 12, it is performed in accordance with the aforementioned Step S102 and Step S103.

At Step S210, the control unit 82 determines whether the charge request signal from the charge checker 15 is stopped or not, that is, whether the charge is completed after the vehicular battery 14 reaches the predetermined amount of charge or not. At this time, when the charge request signal is still received, the charge is continued. On the other hand, when the charge request signal is stopped and the charge is completed, it is determined that the charge of the vehicular battery 14 is completed at Step S211, and turning the switches 22C and 22D and the switches 38A and 38B OFF cuts off the vehicular battery 14 and the rapid charging terminal 36 from the electric power supply line 12.

At Step S212, the discharge circuit 28 is turned ON to step down the electric power supply line 12 to equal to or less than a predetermined voltage. The rapid charge control is thus terminated.

A description will be given of a procedure in the case where the vehicular battery 14 still supplies the electric power for the stop control to the coupling line 56 when the insulation diagnosis is performed in the vehicle system 10 according to the embodiment in accordance with FIG. 4. At this time, any of the above-described Control A, Control B, and Control C are performed for the stop control.

At Step S301, the control unit 82 determines whether the charge request signal is input from the charge checker 72 or not, that is, whether the amount of charge of the fuel cell battery 70 has reached a predetermined amount required for the stop control or not.

When the control unit 82 determines that the amount of charge of the fuel cell battery 70 has reached the predetermined amount at Step S301, the control unit 82 does not change the control state (the Control A, the Control B, and the Control C) in the stop control at Step S302, turns the switches 22C and 22D and the switches 76A and 76B OFF to cut off the vehicular battery 14 and the coupling line 56 from the electric power supply line 12. At this time, after the switches 76A and 76B are turned OFF, and then the switches 220 and 22D are turned OFF, and after the coupling line 56 is cut off from the electric power supply line 12, and then the vehicular battery 14 is cut off from the electric power supply line 12. This causes the fuel cell auxiliary machine 66, the compressor 68, and the DC-DC converter 74 to be driven by the electric power supply from the fuel cell battery 70. Since the electric power supply line 12 is cut off from the vehicular battery 14 and the coupling line 56 at Step S302, the control unit 82 turns the IR sensor 46 ON to apply the voltage for the insulation diagnosis to the electric power supply line 12 at Step S303.

At Step S304, until Step S309 described below, it is determined whether the control unit 82 has not yet received the charge request signal from the charge checker 72 or not, that is, whether the amount of charge of the fuel cell battery 70 is still equal to or more than the predetermined amount or not. Then, when the control unit 82 (a switching control unit) determines that the amount of charge of the fuel cell battery 70 is lower than the predetermined amount, the control unit 82 (the switching control unit) determines that it is difficult to supply the electric power with the fuel cell battery 70 and controls the control state of the stop control to be switched to the Control D (the self-sustained control) at Step S305. The control unit 82 (the stop control unit) maintains the control state of the stop control when it is determined that the amount of charge of the fuel cell battery 70 is still equal to or more than the predetermined amount. Accordingly, when the fuel cell battery 70 can sufficiently cover the electric power required for the stop control, the switching control is not performed during the stop control. It should be noted that in the Control D, the control unit 82 (the stop control unit and the switching control unit) can turn the fuel cell auxiliary machine 66 and the compressor 68 ON using the electric power of the fuel cell stack 58 and the fuel cell battery 70. This causes the amount of power generation of the fuel cell stack 58 to be decreased by the electric power of the fuel cell battery 70 to decrease the heat generation in association with the electric generation of the fuel cell stack 58, and the cooling of the fuel cell stack 58 can be accelerated by that amount.

On the other hand, when the control unit 82 determines that the amount of charge of the fuel cell battery 70 has not reached the predetermined amount at Step S301, the control unit 82 switches the control state of the stop control to the Control D (the self-sustained control) at Step S306, and then at Step S307, turns the switches 22C and 22D and the switches 76A and 76B OFF similarly to the aforementioned Step S302 to cut off the vehicular battery 14 and the coupling line 56 from the electric power supply line 12. This ensures the fuel cell auxiliary machine 66 and the compressor 68 being driven by the electric power supply from the fuel cell stack 58. Then, at Step S308, the control unit 82 turns the IR sensor 46 ON to apply the voltage for the insulation diagnosis to the electric power supply line 12.

When the control unit 82 determines that the amount of charge of the fuel cell battery 70 is equal to or more than the predetermined amount after Step S305 and Step S308, and at Step S304, the control unit 82 determines whether the electric power supply line 12 has the insulation failure or not, that is, whether the electric power supply line 12 has the predetermined insulation resistance or not at Step S309. When the control unit 82 determines that there is the insulation failure at Step S309, the control unit 82 turns the IR sensor 46 OFF and the insulation failure is reported to abort the process afterward at Step S310.

When the control unit 82 determines that there is no insulation failure at Step S309, the control unit 82 turns the IR sensor 46 OFF and turns the switches 22C and 22D and the switches 38A and 38B ON to start the rapid charge of the vehicular battery 14 by the external DC power supply at Step S311.

It should be noted that the control unit 82 determines whether or not the temperature measured by the temperature sensor 60 has decreased to lower than a predetermined temperature of the fuel cell stack 58 that is the upper limit temperature at which the oxidation of the anode is avoidable in the steps from Step S302 to Step S311. When it is determined to have decreased to lower than the predetermined temperature, turning the fuel cell auxiliary machine 66 (the first auxiliary machine), the compressor 68 (the second auxiliary machine), and the DC-DC converter 74 (the third auxiliary machine) OFF terminates the stop control for the fuel cell stack 58.

At Step S312, the control unit 82 determines whether the stop control for the fuel cell stack 58 has been terminated or not, that is, whether all of the fuel cell auxiliary machine 66, the compressor 68, and the DC-DC converter 74 are turned OFF or not.

When the control unit 82 determines that the stop control has been terminated at Step S312, the control unit 82 performs Step S313 similar to Step S210, Step S314 similar to Step S211, and Step S315 similar to Step S212 in turn and terminates the rapid charge control.

Figure 5:
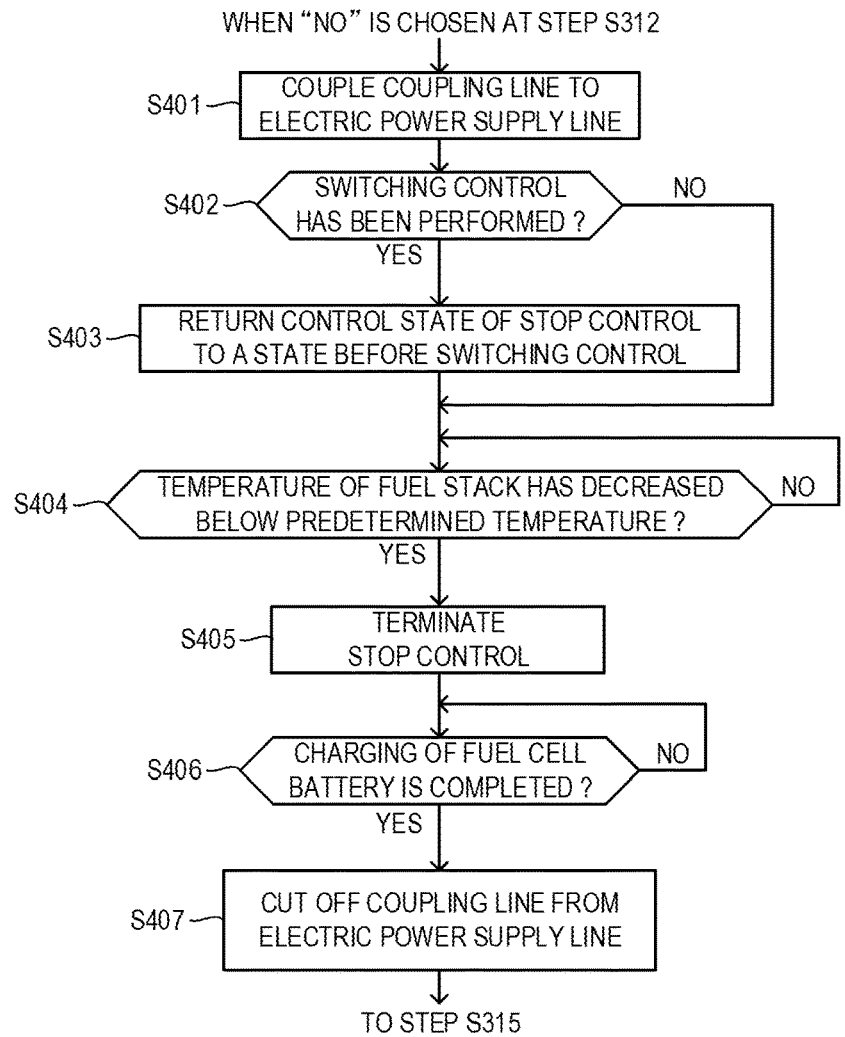
FIG. 5 is a flowchart illustrating a procedure in a case where the stop control is not terminated when a stop control ter urination is determined in FIG. 4.

A description will be given of a procedure in the case where the stop control is not terminated when the stop control termination is determined in the vehicle system 10 according to the embodiment in accordance with FIG. 5. At Step S401, the control unit 82 couples the coupling line 56 to the electric power supply line 12. It should be noted that when the coupling line 56 is coupled to the electric power supply line 12, it is performed in accordance with the aforementioned Step S105 and Step S106.

Coupling the coupling line 56 to the electric power supply line 12 supplies the electric power to the fuel cell auxiliary machine 66, the compressor 68, and the DC-DC converter 74 from the external DC power supply or the vehicular battery 14 and charges the fuel cell battery 70 with the external DC power supply or the vehicular battery 14.

At Step S402, the control unit 82 determines whether Step S304 or Step S305 has been performed or not, that is, whether the switching control of the control state of the stop control has been performed or not. Then, when the switching control has been performed, the control unit 82 performs a control to return the control state of the stop control to a state before the switching control at Step S403. When the cooling efficiency of the Control A, the Control B, and the Control C are higher than that of the Control D, it is preferable to thus return the state to the state before the switching control.

After Step S403, or when the control unit 82 determines that the switching control has not been performed at Step S402, the control unit 82 determines similarly to the above whether or not it has decreased to lower than the predetermined temperature of the fuel cell stack 58 that is the upper limit temperature at which the oxidation of the anode is avoidable at Step S404. When it is determined to have decreased to lower than the predetermined temperature, turning the fuel cell auxiliary machine 66, the compressor 68, and the DC-DC converter 74 OFF terminates the stop control for the fuel cell stack 58 at Step S405.

At Step S406, the control unit 82 determines whether the charge request signal from the charge checker 72 is stopped or not, that is, whether the amount of charge of the fuel cell battery 70 has reached the predetermined amount or not. Then, when the control unit 82 determines that it has reached to the predetermined amount, the control unit 82 turns the switches 76A and 76B OFF to cut off the coupling line 56 from the electric power supply line 12 at Step S407, and the procedure transitions to the aforementioned Step S315.

[Modification of Switching Control]

Figure 6:
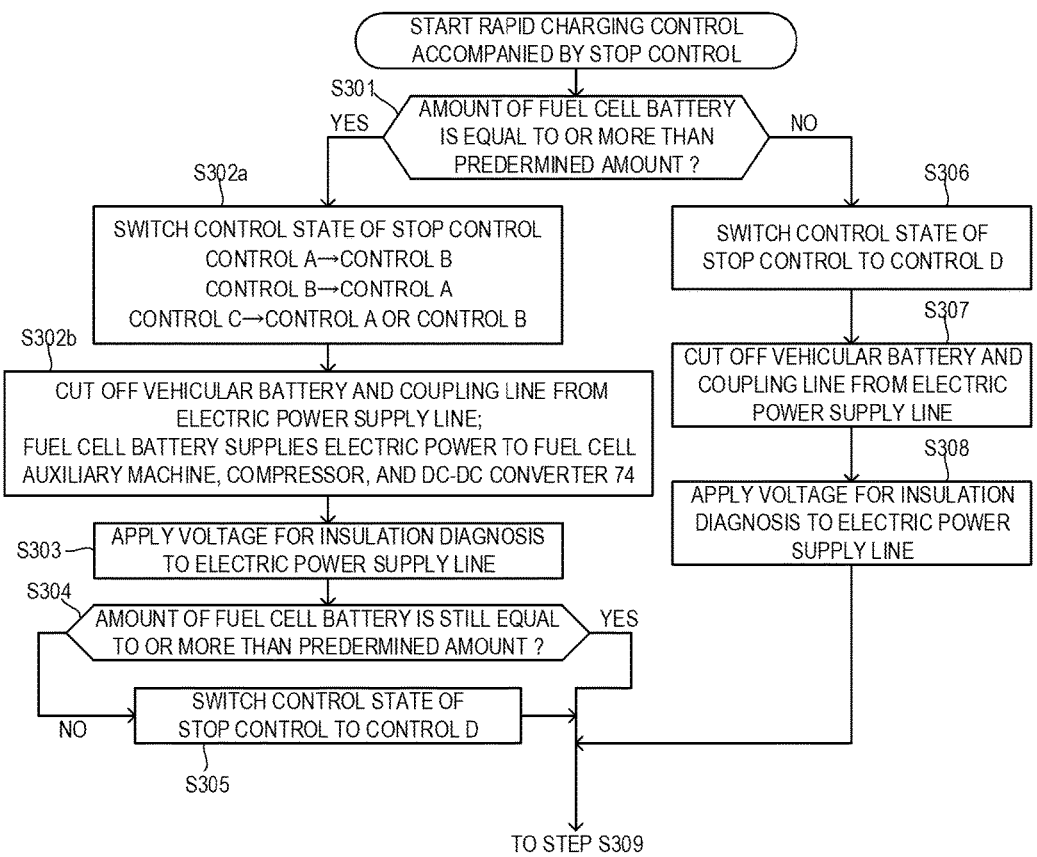
FIG. 6 is a modification of the flowchart illustrated in FIG. 4.

A description will be given of a modification of a procedure in the case where the vehicular battery 14 still supplies the electric power for the stop control to the coupling line 56 when the insulation diagnosis is performed in the vehicle system 10 according to the embodiment in accordance with FIG. 6. Also at this time, any one of the above-described Control A, Control B, and Control C is performed for the stop control. In FIG. 6, Step S302 shown in FIG. 4 becomes Step S302a and Step S302b described below.

When the control unit 82 determines that the amount of charge of the fuel cell battery 70 has reached the predetermined amount at Step S301, the control unit 82 controls to switch the control state in the stop control at Step S302a. On the other hand, when the control unit 82 determines that the amount of charge of the fuel cell battery 70 is lower than the predetermined amount, the procedure transitions to the aforementioned Step S306.

When the power consumption of the Control A is higher than the power consumption of the Control B and the control state before the switching control is the Control A at Step S302a, it is possible to control to switch to the Control B. When the power consumption of the Control B is higher than the power consumption of the Control A and the control state before the switching control is the Control B, it is possible to control to switch to the Control A. When the control state before the switching control is the Control C, it is possible to control to switch to the Control A or the Control B.

At Step S302b, the switches 22C and 22D and the switches 76A and 76B are turned OFF to cut off the vehicular battery 14 and the coupling line 56 from the electric power supply line 12. This ensures the fuel cell auxiliary machine 66, the compressor 68, and the DC-DC converter 74 being driven by the electric power supply from the fuel cell battery 70. Then, the procedure transitions to the aforementioned Step S303. These switching controls ensure decreasing the power consumption of a side of the auxiliary machine to lower than that before the switching control, thereby reducing a load of the fuel cell battery 70.

Figure 4:
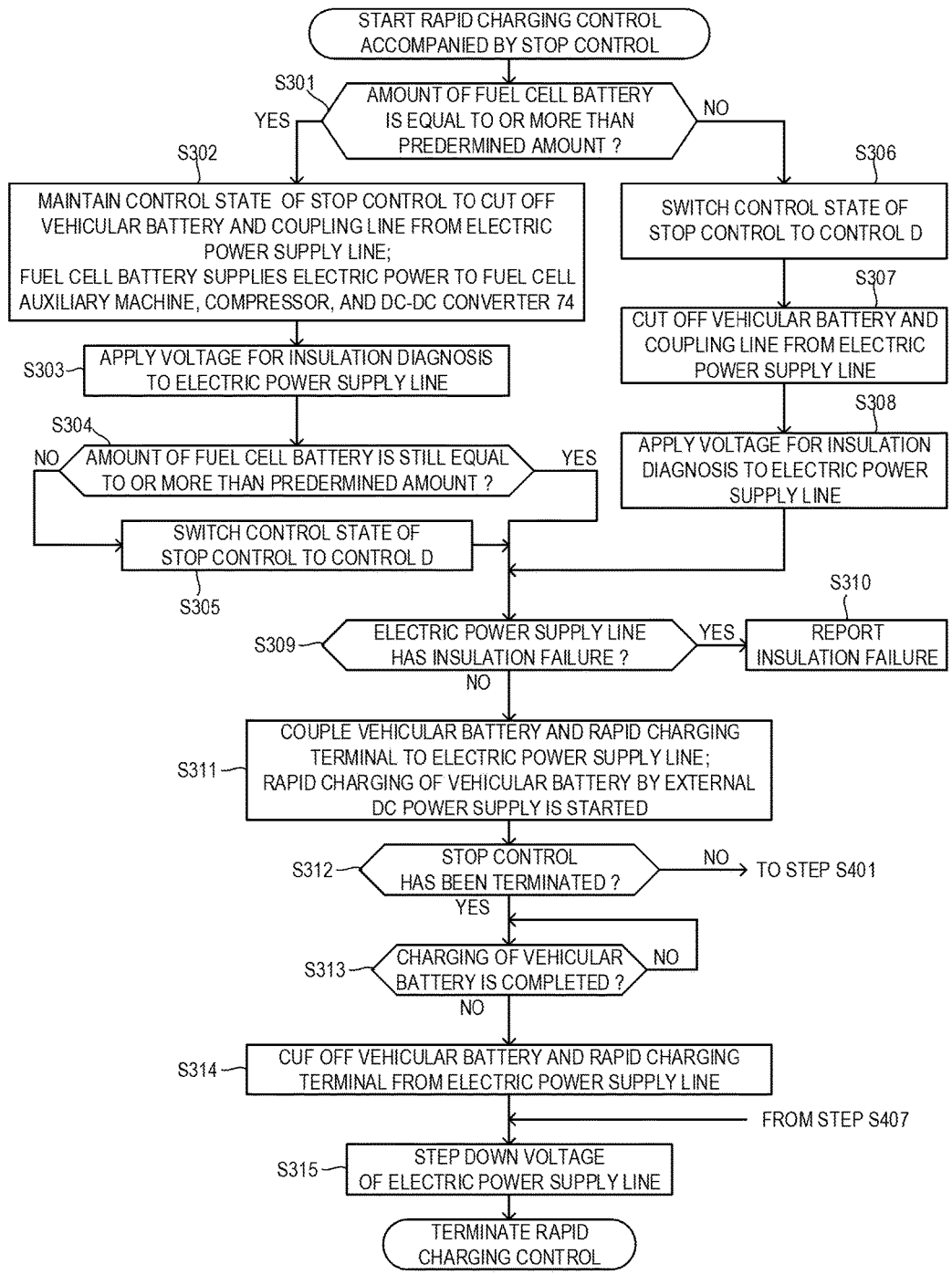
FIG. 4 is a flowchart illustrating a procedure in a case where a vehicular battery still supplies electric power for a stop control to a coupling line when an insulation diagnosis is performed in FIG. 3.

In the procedures shown in FIG. 4 and FIG. 6, Step S301 may be omitted (Step S306, Step S307, and Step S308 may also be omitted) to transition to Step 302 (FIG. 4) and Step S302a (FIG. 6), respectively. That is, the control unit 82 may cause the control to transition to the controls of Step S302 or Step S302a without monitoring the amount of charge of the fuel cell battery 70.

[Low Speed Charge Control Procedure in Vehicle System]

Figure 7:
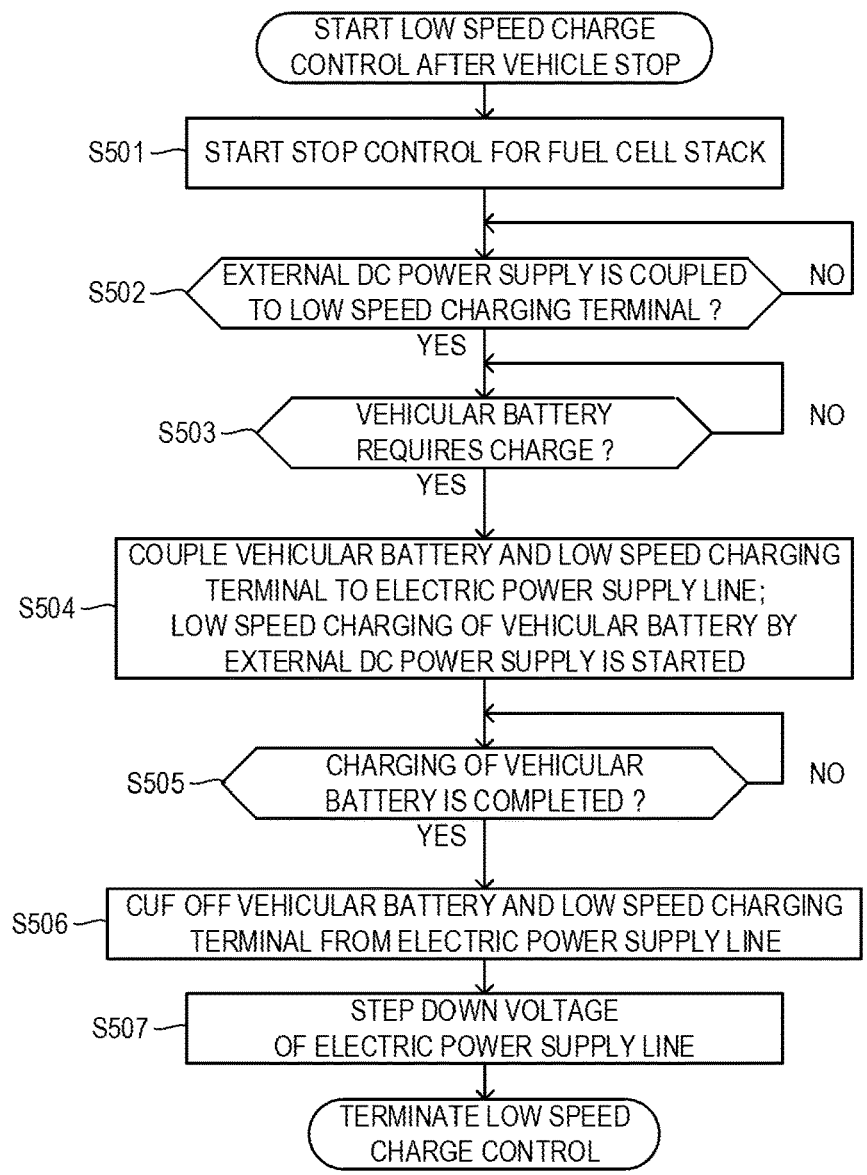
FIG. 7 is a flowchart illustrating a procedure of a low speed charge control after a vehicle stop of the fuel cell equipped vehicle system according to the embodiment.

A low speed charge control procedure after the vehicle stop of the fuel cell equipped vehicle system according to the embodiment will be described in accordance with FIG. 7. At Step S501, the control unit 82 starts the stop control for the fuel cell stack 58. At this time, any one of the Control A, the Control B, the Control C, and the Control D described above is performed for the stop control, and then, the stop control is terminated when it is decreased to lower than the predetermined temperature of the fuel cell stack 58 that is the upper limit temperature at which the oxidation of the anode is avoidable.

At Step S502, the control unit 82 determines whether the detection signal is input from the limit switch of the low speed charging terminal 32 or not, that is, whether the external AC power supply is coupled to the low speed charging terminal 32 or not. After the external AC power supply is coupled to the low speed charging terminal 32, the control unit 82 determines whether the charge request signal is input from the charge checker 15 or not, that is, whether the vehicular battery 14 requires the charge or not at Step S503.

After the control unit 82 determines that the vehicular battery 14 requires the charge, the control unit 82 turns the charger 34 ON to charge the vehicular battery 14 with the external AC power supply coupled to the low speed charging terminal 32 at Step S504. At that time, when the switches 22C and 22D are OFF, the control unit 82 turns the switches 22C and 22D ON to couple the vehicular battery 14 to the electric power supply line 12.

At Step S505, the control unit 82 determines whether the charge request signal from the charge checker 15 is stopped or not, that is, whether the vehicular battery 14 has reached the predetermined amount of charge or not, and continues the charge when the charge request signal is still received. On the other hand, when the charge request signal is stopped, the control unit 82 determines that the charge of the vehicular battery 14 has been completed at Step S506, and turning the switches 22C and 22D and the charger 34 OFF cuts off the vehicular battery 14 and the low speed charging terminal 32 from the electric power supply line 12.

At Step S507, the discharge circuit 28 is turned ON and the electric power supply line 12 is stepped down to equal to or less than the predetermined voltage. The low speed charge control is thus terminated. It should be noted that since an AC voltage having a low voltage is converted into a DC voltage having a high voltage in the low speed charge, the magnitude of the direct current flowing in the electric power supply line 12 in the low speed charge is sufficiently small compared with a case in the rapid charge. Accordingly, unlike the rapid charge, the insulation test in advance is not necessary.

[External Device Coupling Control Procedure in Vehicle System]

An external device coupling control in the embodiment can be executed not only when the vehicle is stopped and the stop control of the fuel cell stack 58 is started but also during the rapid charge control and during the low speed charge control. However, it is not possible to execute in the insulation test in the rapid charge control.

The control unit 82 determines whether the detection signal is input from the limit switch of the external coupling terminal 40 or not, that is, whether the external device is coupled to the external coupling terminal 40 or not. After the external device is coupled to the external coupling terminal 40, the control unit 82 turns the switches 44A and 44B ON to couple the external coupling terminal 40 to the electric power supply line 12. At this time, when any one of the vehicular battery 14, the external DC power supply (the rapid charging terminal 36), and the external AC power supply (the low speed charging terminal 32) is electrically coupled to the electric power supply line 12, the external device can be driven by the electric power supply from any one of the electric power supply coupled to the electric power supply line 12. When none of the electric power supplies is electrically coupled to the electric power supply line 12, it is possible to couple, for example, the vehicular battery 14 to the external device by turning the switches 22C and 22D ON, however it is not possible in the aforementioned insulation test.

Effect of Vehicle System According to Embodiment

With the vehicle system 10 according to the embodiment and the control method thereof, the insulation test is performed after the vehicular battery 14 and the fuel cell stack 58 are cut off from the electric power supply line 12. That is, the control unit 82 turns the IR sensor 46 ON after performing the control to cut off the vehicular battery 14 from the electric power supply line 12 and controlling the switches 76A and 76B to cut off the fuel cell stack 58 from the electric power supply line 12. This ensures performing the insulation test of the electric power supply line 12 with more certainty avoiding an influence of the stray capacitance of the vehicular battery 14 and the fuel cell stack 58 (the coupling line 56).

The control unit 82 cuts off the vehicular battery 14 from the electric power supply line 12 after cutting off the fuel cell stack 58 from the electric power supply line 12. This ensures cutting off the vehicular battery 14 in the step where the fuel cell stack 58 requires the electric power of the vehicular battery 14 when the insulation test is performed, thereby ensuring avoiding the possibility of the unstable stop control of the fuel cell stack 58.

The auxiliary machines for the fuel cell stack 58 (the fuel cell auxiliary machine 66, the compressor 68, and the DC-DC converter 74) coupled to the coupling line 56 are provided. By controlling the switches 76A and 76B to cut off the coupling line 56 from the electric power supply line 12, the control unit 82 cuts off the fuel cell stack 58 from the electric power supply line 12. That is, the fuel cell stack 58 is cut off from the electric power supply line 12 in a state where the auxiliary machines for the fuel cell stack 58 are electrically coupled to the fuel cell stack 58. This ensures the stop control even after the cutoff by the fuel cell stack 58 supplying the electric power to the auxiliary machines.

There are cases where the control unit 82 performs the switching control that switches the control state of the auxiliary machines before the coupling line 56 is cut off from the electric power supply line 12 in a state where the auxiliary machines (the fuel cell auxiliary machine 66, the compressor 68, and the DC-DC converter 74) are driven for the stop control of the fuel cell stack 58. Such cases include the following aspects (1) to (6).

(1) The control unit 82 (the stop control unit) performs the Control A (the forcible cooling) for the stop control (the initial state) of the fuel cell stack 58, and the control unit 82 (the switching control unit) controls its control state to be switched to the Control D (the self-sustained control) before cutting off the coupling line 56 from the electric power supply line 12.

(2) The control unit 82 (the stop control unit) performs the Control B (the anode protection voltage application) for the stop control (the initial state) of the fuel cell stack 58, and the control unit 82 (the switching control unit) controls its control state to be switched to the Control D (the self-sustained control) before cutting off the coupling line 56 from the electric power supply line 12.

(3) The control unit 82 (the stop control unit) performs the Control C (the forcible cooling+the anode protection voltage application) for the stop control (the initial state) of the fuel cell stack 58, and the control unit 82 (the switching control unit) controls its control state to be switched to the Control D (the self-sustained control) before cutting off the coupling line 56 from the electric power supply line 12.

(4) The control unit 82 (the stop control unit) performs the Control A (the forcible cooling) for the stop control (the initial state) of the fuel cell stack 58, and the control unit 82 (the switching control unit) controls its control state to be switched to the Control B (the anode protection voltage application) before cutting off the coupling line 56 from the electric power supply line 12.

(5) The control unit 82 (the stop control unit) performs the Control B (the anode protection voltage application) for the stop control (the initial state) of the fuel cell stack 58, and the control unit 82 (the switching control unit) controls its control state to be switched to the Control A (the forcible cooling) before cutting off the coupling line 56 from the electric power supply line 12.

(6) The control unit 82 (the stop control unit) performs the Control C (the forcible cooling+the anode protection voltage application) for the stop control (the initial state) of the fuel cell stack 58, and the control unit 82 (the switching control unit) controls its control state to be switched to the Control A (the forcible cooling) or the Control B (the anode protection voltage application) before cutting off the coupling line 56 from the electric power supply line 12.

With the above-described (1) to (3), the stop control can be continuously carried on by the self-sustained operation even after the coupling line 56 is cut off from the electric power supply line 12. With the above-described (4) to (6), the power consumption in the auxiliary machine side can be decreased to lower than that before the switching control, thereby ensuring reducing the load of the fuel cell battery 70.

In the above-described (1) to (3), the control unit 82 (the stop control unit and the switching control unit) can perform the control using not only the electric power of the fuel cell stack 58 but also the electric power of the fuel cell battery 70 coupled to the coupling line 56. This ensures the stop control and the switching control of the fuel cell stack 58 using the electric power of the fuel cell battery 70 as well, thereby ensuring decreasing the amount of power generation of the fuel cell stack 58 by that amount. Accordingly, the cooling efficiency of the fuel cell stack 58 can be enhanced by reducing the heat generation amount in association with the electric generation of the fuel cell stack 58.

In the above-described (1) to (3), the control unit 82 maintains the control state in the stop control in the case where the amount of charge of the fuel cell battery 70 is equal to or more than the predetermined amount when the coupling line 56 is cut off from the electric power supply line 12 and performs the switching control to the Control D when the amount of charge of the fuel cell battery 70 decreases to lower than the predetermined amount after the coupling line 56 is cut off from the electric power supply line 12. In the above-described (4) to (6), the control unit 82 performs the switching control to the Control D when the amount of charge of the fuel cell battery 70 decreases to lower than the predetermined amount after this switching control. This causes the switching control to the Control D corresponding to the amount of charge of the fuel cell battery 70 even though the control state after the coupling line 56 is cut off from the electric power supply line 12 is any one of the Control A, the Control B, and the Control C, thereby ensuring avoiding a depletion of the electric power of the fuel cell battery 70.

It should be noted that when the capacity of the fuel cell battery 70 has a sufficient capacity for the stop control, the above-described switching control is not necessary. That is, in the case where the Control A, the Control B, and the Control C are performed for the stop control, these control states can be maintained when the coupling line 56 is cut off from the electric power supply line 12. In particular, when the Control A (the forcible cooling) can be maintained, the stop control can be completed in a short time due to the highest cooling efficiency.

The control unit 82 electrically couples the vehicular battery 14 and the external DC power supply to the electric power supply line 12 after the insulation test of the electric power supply line 12 is performed, and then, electrically couples the fuel cell stack 58 (the coupling line 56) to the electric power supply line 12. This ensures the charge of the vehicular battery 14 (and the fuel cell battery 70), thereby ensuring the activation control of the fuel cell stack 58.

When the aforementioned switching control is performed, the control unit 82 electrically couples the vehicular battery 14 and the external DC power supply to the electric power supply line 12 after performing the insulation test of the electric power supply line 12, and then couples the coupling line 56 to the electric power supply line 12 and returns the control state of the auxiliary machines (the fuel cell auxiliary machine 66, the compressor 68, and the DC-DC converter 74) to a state before the switching control. This causes the vehicular battery 14 and the external DC power supply to cover the electric power of the auxiliary machines so as to ensure enhancing the cooling efficiency of the fuel cell stack 58 by returning the control state of the auxiliary machines to the state before the switching control after the electric power supply line 12 is coupled to the vehicular battery 14 and the external DC power supply when the cooling efficiency of the Control A, the Control B, and the Control C are higher than that of the Control D.

The control unit 82 detects that the external DC power supply is coupled to the rapid charging terminal 36 and cuts off the vehicular battery 14 and the fuel cell stack 58 (the coupling line 56) from the electric power supply line 12. This ensures an automatic cutoff control.

The embodiment of the present invention described above are merely illustration of a part of application examples of the present invention and not of the nature to limit the technical scope of the present invention to the specific constructions of the above embodiments.

The present application claims a priority of Japanese Patent Application No. 2015-243954 filed with the Japan Patent Office on Dec. 15, 2015, and all the contents of which are hereby incorporated by reference.

The invention claimed is:

1. A fuel cell equipped vehicle system in which an external power supply is coupled to an electric power supply line, the electric power supply line being coupled to a fuel cell, an electric power being input/output to/from a vehicular battery through the electric power supply line, the fuel cell equipped vehicle system performing an insulation test of the electric power supply line before charging the vehicular battery, the fuel cell equipped vehicle system comprising:
   an insulation test unit configured to perform the insulation test of the electric power supply line;
   a switch that couples and cuts off between the fuel cell and the electric power supply line; and
   a control unit configured to control a coupling and a cutoff to/from the electric power supply line of the vehicular battery and control the switch, wherein
   the control unit is configured to cut off the vehicular battery from the electric power supply line and control the switch to cut off the fuel cell from the electric power supply line, and then drive the insulation test unit.

2. The fuel cell equipped vehicle system according to claim 1, wherein
   the control unit is configured to cut off the vehicular battery from the electric power supply line after cutting off the fuel cell from the electric power supply line.

3. The fuel cell equipped vehicle system according to claim 2, wherein:
   the fuel cell is coupled to the electric power supply line via a coupling line coupled to the switch,
   the fuel cell equipped vehicle system includes an auxiliary machine for the fuel cell coupled to the coupling line, and
   the control unit is configured to control the switch to cut off the coupling line from the electric power supply line so as to cut off the fuel cell from the electric power supply line.

4. The fuel cell equipped vehicle system according to claim 1, wherein:
   the fuel cell is coupled to the electric power supply line via a coupling line coupled to the switch,
   the fuel cell equipped vehicle system includes an auxiliary machine for the fuel cell coupled to the coupling line, and
   the control unit is configured to control the switch to cut off the coupling line from the electric power supply line so as to cut off the fuel cell from the electric power supply line.

5. The fuel cell equipped vehicle system according to claim 4, wherein
   the auxiliary machine includes:
   a first auxiliary machine that supplies an anode gas to the fuel cell; and
   a second auxiliary machine that supplies a cathode gas to the fuel cell, and the control unit includes:
   a stop control unit configured to stop the first auxiliary machine and drive the second auxiliary machine for a stop control of the fuel cell; and
   a switching control unit configured to perform a switching control that drives the first auxiliary machine while maintaining the driving of the second auxiliary machine before the coupling line is cut off from the electric power supply line.

6. The fuel cell equipped vehicle system according to claim 5, comprising
   a fuel cell battery coupled to the coupling line, wherein
   the switching control unit is configured to perform the switching control using electric power of the fuel cell and the fuel cell battery.

7. The fuel cell equipped vehicle system according to claim 6, wherein
   the stop control unit is configured such that a control state in the stop control is maintained using the electric power of the fuel cell battery when an amount of charge of the fuel cell battery is equal to or more than a predetermined amount when the coupling line is cut off from the electric power supply line, and
   the switching control unit is configured such that the switching control is performed when the amount of charge of the fuel cell battery is decreased to lower than a predetermined amount after the coupling line is cut off from the electric power supply line.

8. The fuel cell equipped vehicle system according to claim 5, wherein
the control unit is configured such that the vehicular battery and the external power supply are electrically coupled to the electric power supply line, and then the coupling line is coupled to the electric power supply line and a control state of the auxiliary machine is returned to a state before the switching control after the insulation test of the electric power supply line is performed when the switching control is performed.

9. The fuel cell equipped vehicle system according to claim 4, wherein
the auxiliary machine includes:
a first auxiliary machine that supplies an anode gas to the fuel cell;
a second auxiliary machine that supplies a cathode gas to the fuel cell; and
a third auxiliary machine that applies an electromotive force that opposes an electromotive force of the fuel cell to the fuel cell from an outside, and
the control unit includes:
a stop control unit configured to stop the first auxiliary machine and the second auxiliary machine and drive the third auxiliary machine for a stop control of the fuel cell; and
a switching control unit configured to perform a switching control that drives the first auxiliary machine and the second auxiliary machine and stops the third auxiliary machine before the coupling line is cut off from the electric power supply line.

10. The fuel cell equipped vehicle system according to claim 4, wherein
the auxiliary machine includes:
a first auxiliary machine that supplies an anode gas to the fuel cell;
a second auxiliary machine that supplies a cathode gas to the fuel cell; and
a third auxiliary machine that applies an electromotive force that opposes an electromotive force of the fuel cell to the fuel cell from an outside, and
the control unit includes:
a stop control unit configured to drive the second auxiliary machine and the third auxiliary machine and stop the first auxiliary machine for a stop control of the fuel cell; and
a switching control unit configured to perform a switching control that drives the first auxiliary machine and stops the third auxiliary machine while maintaining the driving of the second auxiliary machine before the coupling line is cut off from the electric power supply line.

11. The fuel cell equipped vehicle system according to claim 4, comprising
a fuel cell battery coupled to the coupling line, wherein
the auxiliary machine includes:
a first auxiliary machine that supplies an anode gas to the fuel cell;
a second auxiliary machine that supplies a cathode gas to the fuel cell; and
a third auxiliary machine that applies an electromotive force that opposes an electromotive force of the fuel cell to the fuel cell from an outside, and
the control unit includes:
a stop control unit configured to drive the second auxiliary machine and the third auxiliary machine and stop the first auxiliary machine for a stop control of the fuel cell; and
a switching control unit configured to perform a switching control that stops the second auxiliary machine while maintaining the stop of the first auxiliary machine and the driving of the third auxiliary machine before the coupling line is cut off from the electric power supply line.

12. The fuel cell equipped vehicle system according to claim 11, wherein
the switching control unit is configured such that a control to drive the first auxiliary machine and the second auxiliary machine and stop the driving of the third auxiliary machine is performed when an amount of charge of the fuel cell battery is decreased to lower than a predetermined amount after the switching control.

13. The fuel cell equipped vehicle system according to claim 1, wherein
the control unit is configured such that the vehicular battery and the external power supply are electrically coupled to the electric power supply line, and then the fuel cell is electrically coupled to the electric power supply line after the insulation test of the electric power supply line is performed.

14. The fuel cell equipped vehicle system according to claim 1, comprising
a charging terminal configured to couple to the external power supply, wherein
the control unit is configured to detect that the external power supply is coupled to the charging terminal and cut off the vehicular battery and the fuel cell from the electric power supply line.

15. A control method for a fuel cell equipped vehicle system in which an external power supply is coupled to an electric power supply line, the electric power supply line being coupled to a fuel cell, an electric power being input/output to/from a vehicular battery through the electric power supply line, the fuel cell equipped vehicle system performing an insulation test of the electric power supply line before charging the vehicular battery, the control method comprising
performing the insulation test after the vehicular battery and the fuel cell are cut off from the electric power supply line.

16. The control method for a fuel cell equipped vehicle system according to claim 15, comprising
cutting off the vehicular battery from the electric power supply line after the fuel cell is cut off from the electric power supply line.

17. The control method for a fuel cell equipped vehicle system according to claim 16, comprising
cutting off the fuel cell from the electric power supply line in a state where an auxiliary machine for the fuel cell is electrically coupled to the fuel cell.

18. The control method for a fuel cell equipped vehicle system according to claim 15, comprising
cutting off the fuel cell from the electric power supply line in a state where an auxiliary machine for the fuel cell is electrically coupled to the fuel cell.

* * * * *